United States Patent [19]
Todokoro et al.

[11] Patent Number: 5,872,358
[45] Date of Patent: Feb. 16, 1999

[54] SCANNING ELECTRON MICROSCOPE

[75] Inventors: Hideo Todokoro, Tokyo; Makoto Ezumi, Mito, both of Japan

[73] Assignee: Hitachi, Ltd., Tokyo, Japan

[21] Appl. No.: 733,857

[22] Filed: Oct. 18, 1996

[30] Foreign Application Priority Data

Oct. 19, 1995 [JP] Japan .................................. 7-271460

[51] Int. Cl.[6] .................................................. H01J 37/28
[52] U.S. Cl. .......................................... 250/310; 250/397
[58] Field of Search .................................. 250/310, 397

[56] References Cited

U.S. PATENT DOCUMENTS

| | | | |
|---|---|---|---|
| 3,792,263 | 2/1974 | Hashimoto et al. | 250/310 |
| 4,330,707 | 5/1982 | Manzke | 250/310 |
| 4,658,136 | 4/1987 | Ohtaka et al. | 250/397 |
| 5,389,787 | 2/1995 | Todokoro et al. | 250/310 |
| 5,424,541 | 6/1995 | Todokoro | 250/310 |
| 5,502,306 | 3/1996 | Meisberger et al. | 250/310 |
| 5,578,821 | 11/1996 | Meisberger et al. | 250/310 |
| 5,608,218 | 3/1997 | Sato et al. | 250/310 |

FOREIGN PATENT DOCUMENTS 60-243959  12/1985  Japan .

OTHER PUBLICATIONS

IEEE 9th Annual Symposium on Electron, Ion and Laser Technology, San Francisco Press, Inc., Pease, Low Voltage Scanning Electron Microscope, 1967, pp. 176–187.

*Primary Examiner*—Jack I. Berman
*Attorney, Agent, or Firm*—Kenyon & Kenyon

[57] ABSTRACT

A scanning microscope is provided for producing a scan image at high spatial resolution and in a low acceleration voltage area. An acceleration tube is located in an electron beam path of an objective lens for applying a post-acceleration voltage of the primary electron beam. The application of an overlapping voltage onto a sample allows a retarding electric field against the primary electron beam to be formed between the acceleration tube and the sample. The secondary electrons generated from the sample and the secondary signals such as reflected electrons are extracted into the acceleration tube through the effect of an electric field (retarding electric field) immediately before the sample. The signals are detected by secondary signal detectors located upwardly than the acceleration tube.

29 Claims, 13 Drawing Sheets

SCANNING ELECTRON MICROSCOPE

BACKGROUND OF THE INVENTION (a) Field of the Invention

The present invention relates in general to a scanning electron microscope for obtaining a two-dimensional scanning image showing a shape, a composition or the like of a surface of a sample by scanning the surface of the sample to be inspected with an electron beam, and more particularly to a scanning electron microscope which is suitable for obtaining a scanning image having high resolution in a low acceleration voltage region.

(b) Description of the Prior Art

In a scanning electron microscope, a two-dimensional scanning image is obtained in such a way that electrons which have been emitted from an electron source of a heating type or a field emission type are accelerated so as to be formed into a slender electron beam (a primary electron beam) through an electrostatic or electromagnetic lens, a surface of a sample to be observed is scanned with the resultant primary electron beam using a scanning deflector, a secondary signal is detected which is formed by secondary electrons or reflected electrons which are secondarily generated from the sample by irradiation with the primary electron beam, and the intensity of the detected signal is made an input for the intensity modulation in a cathode ray tube (CRT) which is scanned synchronously with the scanning of the primary electron beam. In the general scanning electron microscope, the electrons which have been emitted from the electron source are accelerated in a space between the electron source, to which a negative electric potential is applied, and an anode electrode at ground electric potential, and the surface of the sample to be inspected at ground electric potential is scanned with the electron beam.

As the result of the fact that the scanning electron microscope has become used in the process of the manufacture of semiconductor devices or in the inspection after completion thereof (e.g., the size measurement and the inspection of the electrical operation thereof using the electron beam), there has been required a high resolution of 10 nm or less at a low acceleration voltage of 1,000 V or lower with which an insulating material can be observed without being charged with electricity.

The primary factor which impedes attaining of high resolution in the low acceleration voltage region is the blur of the electron beam due to the chromatic aberration which results from the dispersion in the energy of the electron beam emitted from the electron source. In a scanning electron microscope of the low acceleration voltage type, in order to reduce the blur due to the chromatic aberration, there is mainly employed an electron source of a field emission type in which the dispersion in the energy of the emitted electron beam is small. However, even in the case of an electron source of the field emission type, the space resolution at a voltage of 500 V is limited to the range of 10 to 15 nm. This does not fulfill the requirement by users.

As for the measure of solving the above-mentioned problem, there is known a method wherein an acceleration voltage of the primary electron beam between an electron source and an anode electrode at the grounding electric potential is set to a value higher than the final acceleration voltage, and the primary electron beam is decelerated in a space between an objective lens at ground electric potential and a sample to be inspected to which a negative electric potential is applied, whereby the acceleration voltage of interest is set to the final low acceleration voltage (refer to Proceedings of IEEE 9th Annual Symposium on Electron, Ion and Laser Technology, pp. 176 to 186).

The effects which are provided by this method were previously confirmed by the experiments relating thereto. However, that technology has hardly been adopted commercially since the secondary electrons are drawn into an evacuable enclosure through the retarding electric field so that they are difficult to detect; and a specimen stage having high electrical insulating characteristics is required because a high voltage is applied to the sample.

SUMMARY OF THE INVENTION

The present invention provides a breakthrough to the above-mentioned problems associated with the prior art. According to the present invention, the problem associated with detection of the secondary signal is solved by the provision of means for detecting, after it has passed through an objective lens, a secondary signal formed by secondary electrons, reflected electrons or the like which are extracted into an aperture of the objective lens by an electric field applied across the objective lens and a sample. In addition, by provision of post-acceleration means in an objective lens passage, a negative electric potential applied to the sample is reduced down o a practicable value. In such a way, a structure of a scanning electron microscope is realized which can be adopted to a commercial system.

That is, according to the present invention, there is provided a scanning electron microscope having an electron source, a scanning deflector by means of which the sample is scanned with a primary electron beam generated from the electron source, an objective lens for condensing the primary electron beam, and a secondary signal detecting unit for detecting a secondary signal which has been generated from the sample by irradiation of the primary electron beam in order to obtain a two-dimensional scanning image of a sample, the scanning electron microscope including an acceleration tube arranged in an acceleration beam passage of the objective lens, means for applying a post-acceleration voltage of the primary electron beam to the acceleration tube, and means for forming a retarding electric field for the primary electron beam, in a space between the acceleration tube and the sample, wherein the secondary signal detecting unit is arranged in a position closer to the electron source than to the acceleration tube.

According to the present invention, it is possible to solve both the problem that it is difficult to detect the secondary electrons or the reflected electrons, and the management problem resulting from the fact that a high electric potential is applied to the sample. As a result, it is possible to realize a scanning electron microscope in which the chromatic aberration is reduced in the low acceleration voltage region.

The secondary signal detecting unit may include a conductive target plate having an aperture through which the primary electron beam passes, extraction means for extracting secondary electrons generated from the conductive target plate, and detection means for detecting the secondary electrons extracted into the extraction means. The extraction means is formed by both an electric field and a magnetic field crossing the electric field so that deflection of the primary electron beam due to the electric field can be canceled by the magnetic field. The method of detecting the secondary signal of this system may also be applied to either the case where no acceleration tube is provided, or the case where the electric potential of the acceleration tube is made 0V (ground electric potential).

The secondary signal detecting unit may be comprised of either a multi-channel plate having an aperture through which the primary electron beam passes, or a photo detector having an aperture, through which the primary electron beam passes, for detecting light emission of fluorescent substance.

The installation place of the secondary signal detecting unit may be either one or both of a position located between the acceleration tube and a scanning deflector, and a position located between the scanning deflector and the electron source. In the case where the secondary signal detecting unit is provided in each of the two positions, the scanning image can be formed using one of the detection signals therefrom, or the scanning image can be formed by calculating the detection signals from the respective detectors. Which of methods the scanning image is formed on the basis of may be automatically selected in correspondence to the magnification of the scanning image or the regiven observation conditions. The method employing the two secondary signal detecting units may also be applied to either the case where no acceleration tube is provided, or the case where the electric potential of the acceleration tube is made 0 V (ground electric potential).

By combining electrostatic deflection with electromagnetic deflection, the scanning deflector for the primary electron beam can be designed so as to give the desired deflection to the primary electron beam, but not to give a deflection to the secondary signal which has been extracted from the sample side. This deflection method wherein electrostatic deflection is combined with electromagnetic deflection may also be applied to the case where no acceleration tube is provided.

If both the post-acceleration voltage and the voltage to be applied to the sample are controlled while maintaining both a ratio of the post-acceleration voltage to be applied to the acceleration tube to the electron gun voltage to be applied to the electron source, and a ratio of the voltage to be applied to the sample to the electron gun voltage to be applied to the electron source constant, it is possible to maintain the cross over point of the secondary signal generated form the sample at a fixed position.

The lens center formed by the magnetic field of the objective lens is aligned with the lens center of the electrostatic lens formed between the acceleration tube and the sample, whereby it is possible to remove the distortion of the scanning image due to the function of the electrostatic lens formed by the retarding electric field.

If the upper magnetic poles of the objective lens are electrically insulated from the remaining portion of the objective lens and the post-acceleration voltage is applied thereto so that the upper magnetic poles also act as the acceleration tube, the alignment of the lens center of the electromagnetic lens with the lens center of the electrostatic lens can be readily carried out.

BRIEF DESCRIPTION OF THE DRAWINGS

The above and other objects as well as advantages of the present invention will become clear by the following description of embodiments of the present invention with reference to the accompanying drawings, wherein.

DETAILED DESCRIPTION

Figure 1:
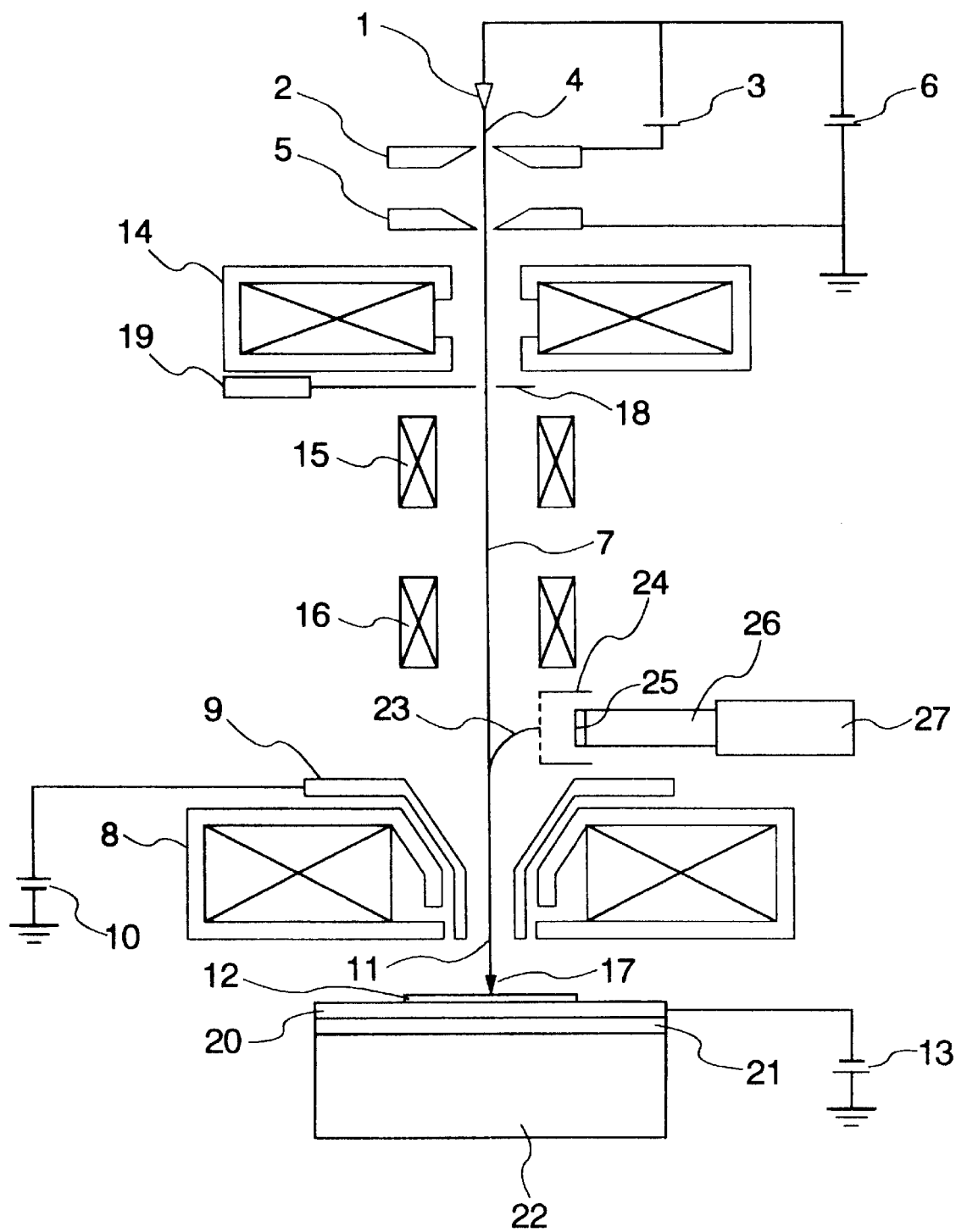
FIG. 1 is a schematic view showing a structure of an embodiment of the present invention.

Referring first to FIG. 1, there is illustrated a schematic view showing a structure of an embodiment of a scanning electron microscope according to the present invention. At the time when an extraction voltage 3 is applied across a field emission cathode 1 and an extraction electrode 2, electrons 4 are emitted from the cathode 1. The electrons 4 thus emitted are further accelerated (or decelerated in some cases) in a space between the extraction electrode 2 and an anode 5 at ground electric potential. The energy (the acceleration voltage) of an electron beam which has passed through the anode 5 matches an electron gun acceleration voltage 6. In the present invention, the electron beam 7 thus accelerated is further post-accelerated through an acceleration tube 9 which is arranged so as to interpenetrate an objective lens 8. The energy of the electron beam when passing through the objective lens 8 becomes equal to the sum of the electron gun acceleration voltage 6 and a post-acceleration voltage 10 which is applied to the acceleration tube 9. A primary electron beam 11 which has been post-accelerated is decelerated by a negative superimposed voltage 13 applied to a sample 12 so as to obtain a desired acceleration voltage. The substantial acceleration voltage in this method becomes equal to a difference between the electron gun acceleration voltage 6 and the superimposed voltage 13 irrespective of the magnitude of the post-acceleration voltage 10.

The primary electron beam 7 which has passed through the anode 5 is subjected to the scanning deflection through a condenser lens 14, a upper scanning deflector 15 and a lower scanning deflector 16, and then is further accelerated by the post-acceleration voltage 10 in the acceleration tube 9 provided through the passage of the objective lens 8. A primary electron beam 11 thus post-accelerated is narrowly condensed onto the sample 12 by the objective lens 8. The primary electron beam 11 which has passed through the objective lens 8 is decelerated by a retarding electric field 17 which is formed in a space between the objective lens 8 and the sample 12 so as to reach the surface of the sample 12.

By virtue of this structure, the acceleration voltage of the primary electron beam when passing through the objective lens 8 becomes higher than the final acceleration voltage. As a result, as compared with the case where the primary electron beam having the final acceleration voltage passes through the objective lens 8, the chromatic aberration in the objective lens is reduced, and hence a narrower electron beam (high resolution) can be obtained. An opening angle of the primary electron beam in the objective lens 8 is determined by a diaphragm 18 which is arranged below the condenser lens 14. The operation of centering the diaphragm 18 is carried out by adjusting an adjustable lug 19. In this connection, while the mechanical adjustment is carried out using the adjustable lug 19 in the figure, alternatively, there may be adopted a measure wherein electrostatic or electromagnetic deflectors are respectively provided before and after the diaphragm 18 so as to suitably deflect the electron beam for adjustment of the centering thereof.

The surface of the sample 12 is scanned with the electron beam which has been narrowly condensed by the objective lens 8 by both the upper scanning deflector 15 and the lower scanning deflector 16. In this connection, both the deflection direction and the intensity of each of the upper scanning deflector 15 and the lower scanning deflector 16 are adjusted in such a way that the scanning electron beam always passes through the center of the objective lens 8. The sample 12 is mounted to a sample holder 20 to which a superimposed voltage 13 is applied. The sample holder 20 is placed on a specimen stage 22 through an insulating stage 21 so that the horizontal position of the sample holder 20 can be suitably adjusted.

The sample 12 is irradiated with the primary electron beam 11, thereby generating secondary electrons 23. Since a retarding electric field 17 which is formed in a space between the objective lens 8 and the sample 12 serves as an acceleration electric field for the secondary electrons 23, the secondary electrons 23 are extracted into the passage of the objective lens 8 and rise upwardly while being influenced thereupon by the lens function established by the magnetic field of the objective lens 8. The secondary electrons 23 which have passed through the objective lens 8 are extracted by the electric field in the transverse direction of an extraction electrode 24 which is arranged between the objective lens 8 and the lower scanning deflector 16. After having diffused through a mesh of the extraction electrode 24, the secondary electrons 23 are accelerated by a scintillator 25 to which 10 kV (a positive electric potential) is applied so as to cause the scintillator 25 to emit light. The light thus emitted is introduced through light guide 26 into a photo multiplier (PM) 27 which converts it into an electrical signal. An output of the photo multiplier 27 is further amplified to be an intensity modulation input to a cathode ray tube (CRT)(not shown).

The feature of this structure is that the acceleration voltage of the electron beam when passing through the condenser lens 14, the diaphragm 18 and the objective lens 8 is higher than the final energy. In particular, it is higher while passing through the objective lens 8. So as to control the chromatic aberration in this course, the electron beam is further post-accelerated. In a typical example, when the electron gun acceleration voltage, the post-acceleration voltage, and the negative superimposed voltage applied to the sample 18 are 1,000 V, 1,000 V and 500 V, respectively, the substantial acceleration voltage is 500 V. The chromatic aberration is reduced by about 50% since the acceleration voltage is 2,000 V when the electron beam is passing through the objective lens 8. In the case where the acceleration voltage is 500 V, the beam diameter (resolution) which was 15 nm in the former case is improved down to 7 nm.

In the above-mentioned embodiment, the secondary electrons 23 are extracted to the outside of the electron beam passage by the extraction electrode 24 so as to be detected. In this method, the energy of the secondary electrons 24 is increased as the superimposed voltage 13 is further increased, and therefore, the voltage to be applied to the extraction electrode 24 needs to be correspondingly increased. As a result, there arises a problem that the primary electron beam (the accelerated electron beam 7) is also deflected.

Figure 2:
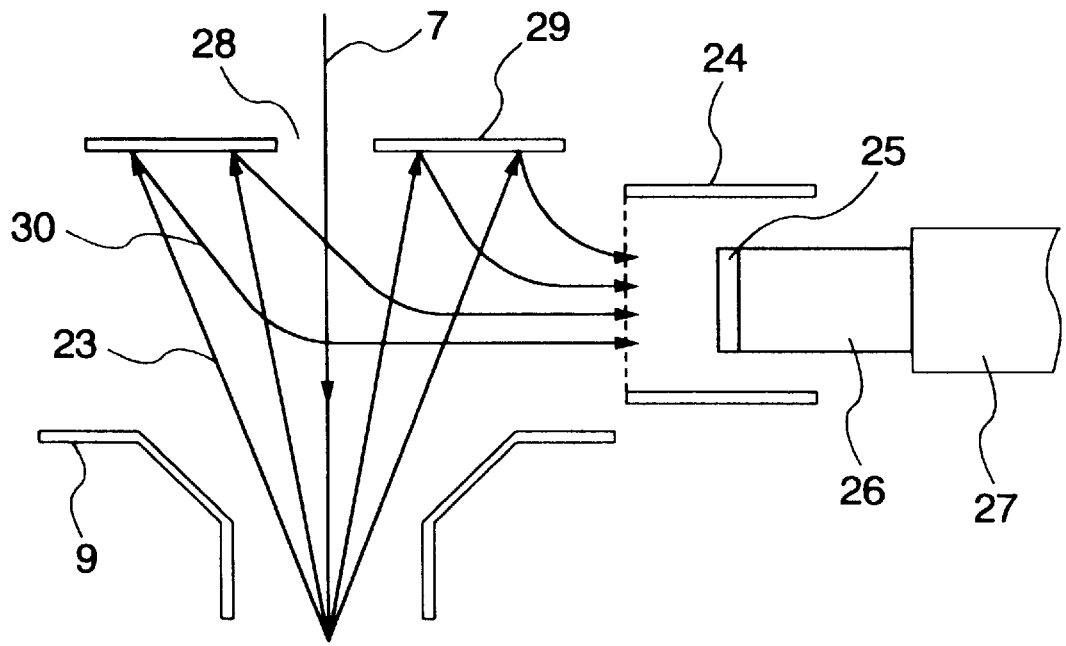
FIG. 2 is a schematic view useful in explaining a structure of an embodiment in which a target plate employed therein is used to detect a secondary signal.

An embodiment employing a target plate as shown in FIG. 2 solves the above-mentioned problem and makes the detection of high efficiency possible. In the present embodiment, there is provided a target plate 29 having a central hole 28 in the electron beam passage. The surface of the target plate 29 is coated with a material, such as gold, silver or platinum, from which the secondary electrons are readily generated by the electron irradiation. After having passed through the central hole 28 of the target plate 29, the accelerated primary electron beam 7 enters into the acceleration tube 9. The diameter of the central hole 28 is set to a value with which the electron beam which has been deflected by both the upper and lower scanning deflectors 15 and 16 has no collision with the target plate 29. The secondary electrons 23 which have been generated from the sample 12 and then are accelerated by the superimposed voltage 13 pass through the acceleration tube 9 while being caused to diverge by the lens function of the objective lens 8, and then collide with the rear face of the target plate 29. Although different in orbit from the secondary electrons, likewise, the reflected electrons which have been generated from the sample 12 collide with the rear face of the target plate 29.

Secondary electrons 30 which have been generated from the rear face of the target plate 29 are extracted by the electric field provided by the extraction electrode 24, and then similarly to the case shown in FIG. 1 converted into an electrical signal via the scintillator 25, the light guide 26 and the photomultiplier 27. The feature of this structure is that even if the superimposed voltage 13 applied to the sample is high and hence the acceleration for the secondary electrons 23 is increased, since the object of detection is the secondary electrons 30 which have been generated from the target plate 29 and are not accelerated, the voltage applied to the extraction electrode 24 may be low. For this reason, it is possible to reduce the influence of the electric field provided by the extraction electrode 24 upon the primary electron beam 7. While the scintillator 25 is used to detect the extracted secondary electrons in this case, alternatively, an electron detection amplifier such as a channel plate or a multi-channel plate may instead be employed.

Figure 3:
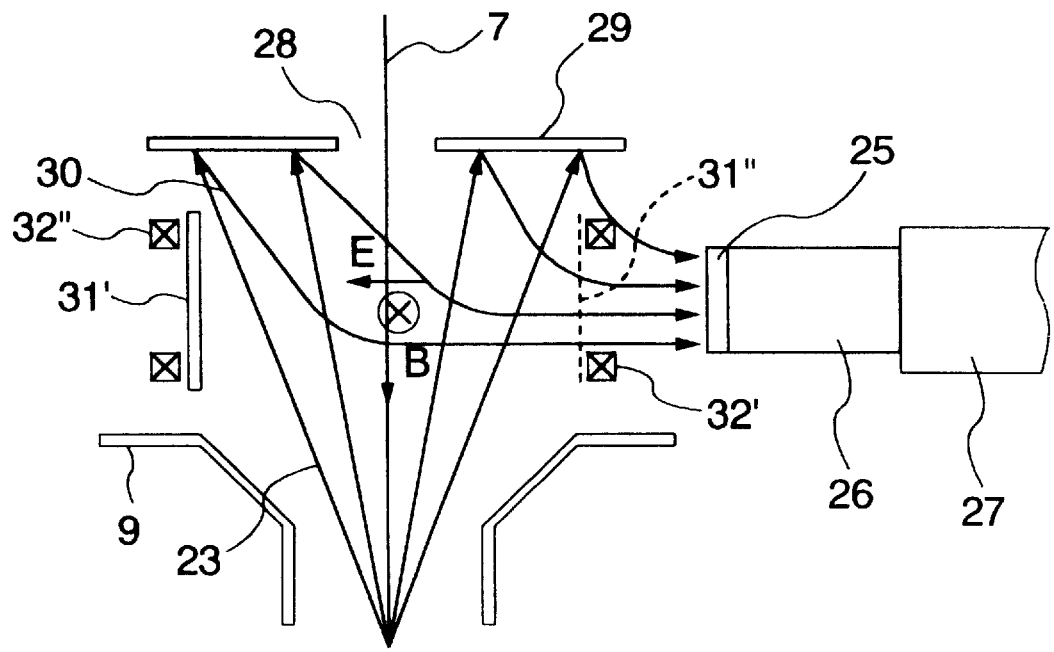
FIG. 3 is a schematic view useful in explaining a structure of an embodiment in which a target plate employed therein is used to detect a secondary signal, and an electric field and a magnetic field crossing the electric field are employed to extract secondary electrons in order to prevent deflection of primary electrons.

Referring to FIG. 3, there is shown an example wherein a magnetic field B is applied so as to cross an electric field E for extracting the secondary electrons 30 which have been generated from the target plate 29. By adopting this structure, it is possible to correct the deflection of the primary electron beam 7 provided by the above-mentioned extracting electric field E. In other words, the deflection of the primary electron beam 7 provided by the extracting electric field E can be corrected by the deflection provided by the magnetic field B. Now, reference numerals 31' and 31" designate electric field deflecting electrodes for generating the extracting electric field, respectively. One electric field deflecting electrode 31" is formed of a mesh so that the secondary electrons 30 can diffuse therethrough. Reference numerals 32' and 32" designate transverse magnetic field deflecting coils (the coils 32' and 32" for generating the magnetic field B are symbolically illustrated in the figure). The magnetic field B which is formed by the transverse magnetic field deflecting coils 32' and 32" crosses the electric field E, and the intensity of the magnetic field B is adjusted so as to cancel the deflection provided by the electric field E which is applied to the accelerated electron beam 7. While a pair of transverse magnetic field deflecting coils 32 are employed in the present embodiment, if two pairs of transverse magnetic field deflecting coils are employed which are arranged so as to form a suitable angle therebetween, the degree of orthogonality between the electric field and the magnetic field can be rigidly adjusted by adjusting the current which is caused to flow through each pair, or the like. It is to be understood that even if instead of providing the two pairs of transverse magnetic field deflecting coils 32, two pairs of electric field deflecting electrodes are provided in order to adjust the direction of the electric field, likewise, the degree of orthogonality between the electric field and the magnetic field anc be rigidly adjusted.

Incidentally, the secondary signal detecting method employing the target plate 29 shown in FIGS. 2 and 3 is available to either the case where no acceleration tube 9 is provided, or the case where the acceleration tube 9 is grounded.

Figure 4:
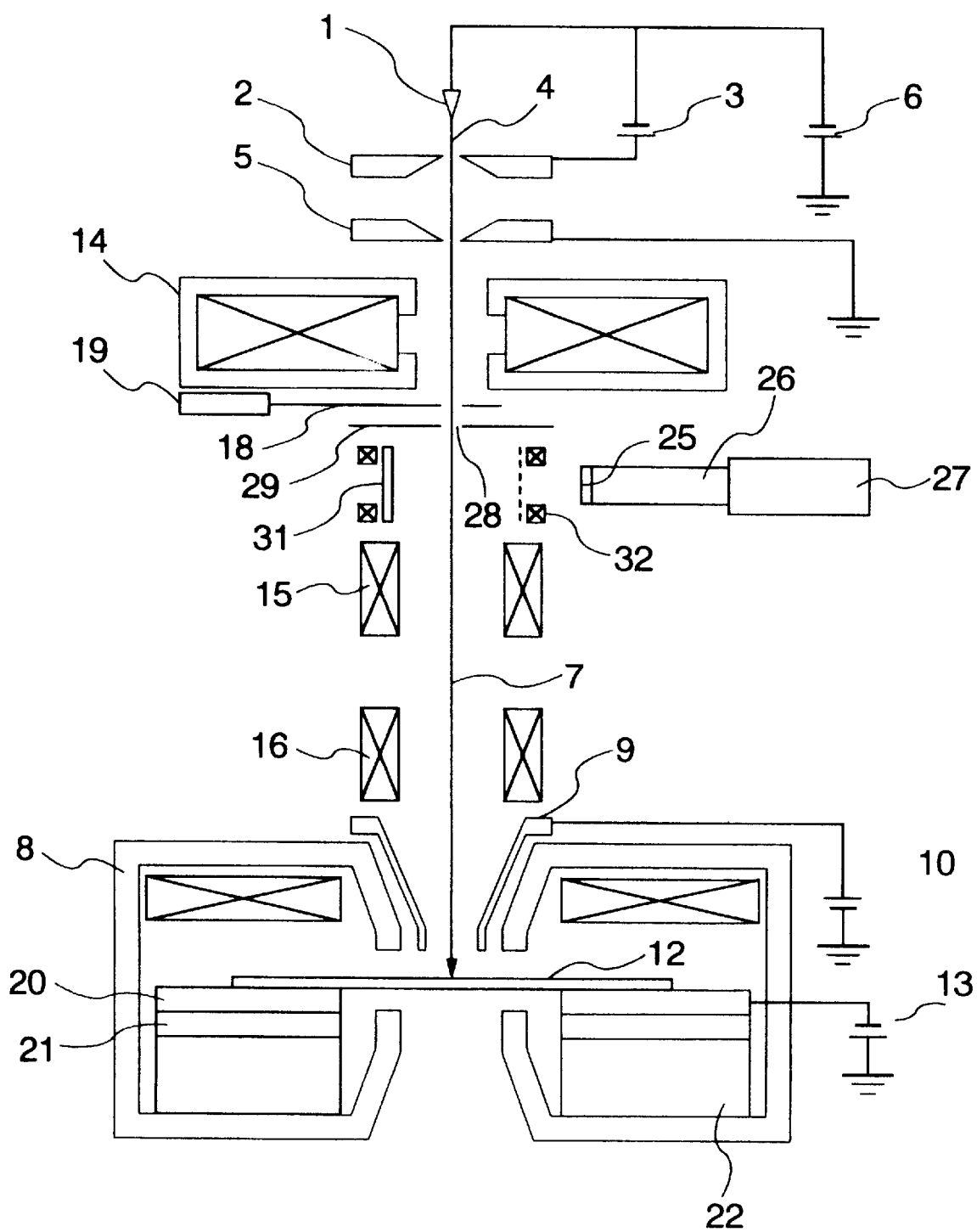
FIG. 4 is a schematic view useful in explaining a structure of an embodiment in which a secondary signal detecting unit is provided above a scanning deflector.

Referring to FIG. 4, there is illustrated an embodiment wherein the secondary signal detecting unit is provided above the upper scanning deflector 15. In the figure, the secondary signal detecting unit is provided between the upper scanning deflector 15 and the diaphragm 18. While similarly to the case of FIG. 2, the target plate 29 has the central hole 28 bored therethrough, since the primary electron beam is not yet subjected to the scanning deflection in this position, the diameter of the central hole 28 may be the same as that of the diaphragm 18 for limiting an angular aperture of the minimum primary electron beam. In the present embodiment in the figure, the target plate 29 having a central hole 28 with 0.1 mm diameter is arranged below the diaphragm 18. In this connection, the diaphragm 18 may also serve as the target plate 29.

In the case where the target plate 29 was arranged below the scanning deflector, the diameter of the central hole 28 of the target plate 29 was set to a value such that the deflected electron beam does not collide with the target plate 29. Comparing the diameters of the central holes 28 with each other with respect to the respective typical examples, a diameter of 3 to 4 mm is required in the case where the target plate 29 is arranged below the scanning deflector, while a diameter of 0.1 mm or smaller may be available in the case where the target plate 29 is arranged above the scanning deflector. Thus, since if the target plate is arranged above scanning deflector, the central hole of the target plate can be made sufficiently small, the efficiency of capturing the secondary electrons by the target plate is necessarily improved.

In the present embodiment shown in FIG. 4, the sample 12 is placed within a lens gap of the objective lens 8. This arrangement contributes to the reduction of the chromatic aberration coefficient of the objective lens 8, and has a shape for seeking higher resolution. The specimen stage 22 is also provided within the objective lens 8.

Figure 5:
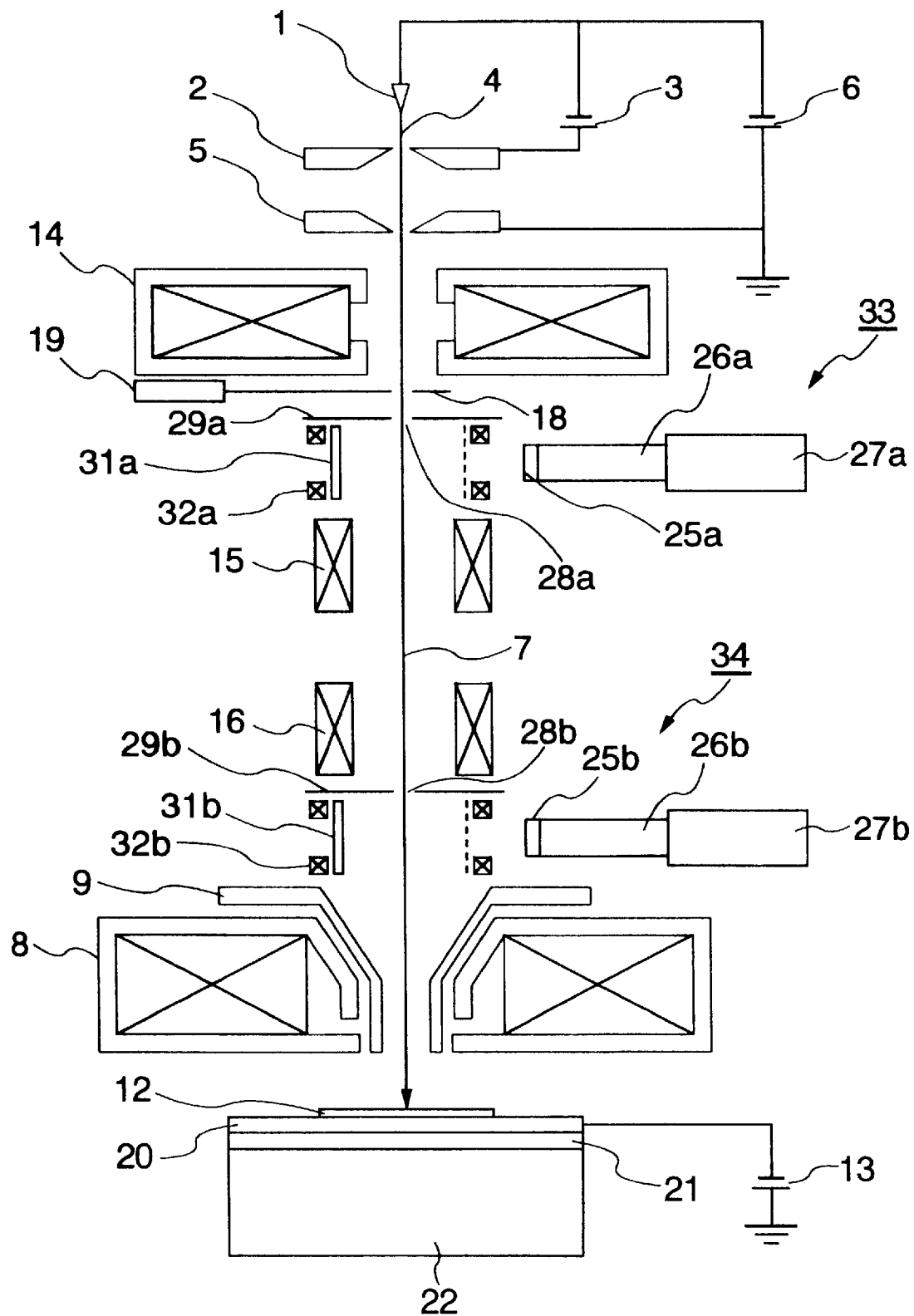
FIG. 5 is a schematic view useful in explaining a structure of an embodiment in which secondary signal detecting units are respectively provided above and below the scanning deflector.

Referring to FIG. 5, there is illustrated an embodiment wherein the secondary signal detecting units are provided in both the upper position and the lower position of the scanning deflector, respectively. That is, a upper detector 33 is provided above the upper scanning deflector 15, while a lower detector 34 is provided between the lower scanning deflector 16 and the acceleration tube 9. As shown in FIGS. 3 and 4, the upper detector 33 and the lower detector 34 include the target plates 29a and 29b, the electric field deflecting electrodes 31a and 31b, the transverse magnetic field deflecting coils 32a and 32b, the scintillators 25a and 25b, the light guides 26a and 26b, and the photo multipliers 27a and 27b, respectively.

In the present embodiment, the secondary electrons or the reflected electrons which have passed through the central hole 28b of the target plate 29b of the lower detector 34 can be detected by the upper detector 33. Since the secondary signal which is detected by the upper detector 33 contains a large number of secondary electrons and reflected electrons which have been emitted from the sample 12 perpendicularly thereto, an image can be obtained which is different in the contrast from that in the lower detector 34. For example, in the inspection of the contact holes in the process of manufacturing a semiconductor device, if the lower detector 34 is used, an image having a contact hole image portion which is emphasized from the periphery thereof can be obtained, while if the upper detector 33 is used, the detailed image of the bottom of the contact hole can be obtained. In addition, the contrast in which the features of the sample is emphasized can be formed by calculating the signals output from the detectors 33 and 34, respectively.

While which of the outputs from the upper and lower detectors the scanning image is formed from can be selected by an operator, alternatively, it may be automatically selected under predetermined conditions. For example, in the case where the observation magnification is 2,000 or lower, the lower detector 34 is selected, while in the case where the observation magnification is 2,000 or higher, the upper detector 33 is selected. In addition, which of the upper and lower detectors should be used may be determined in correspondence to the sample to be observed. In this case, the procedure of inputting data relating to the kind of sample to be observed to the system, and so forth is carried out. For example, when the data relating to the observation of the contact hole of a semiconductor device is input, the upper detector 33 with which the image of the inside of the contact hole is emphasized is automatically selected, while when a photo resist film applied to the surface of the substrate body is observed, the lower detector 34 is selected.

Incidentally, in the embodiment shown in FIG. 4 or FIG. 5, even if the acceleration tube 9 is removed or the acceleration tube 9 is grounded, the effect associated therewith is great and hence such a case is sufficiently practical.

Figure 6:
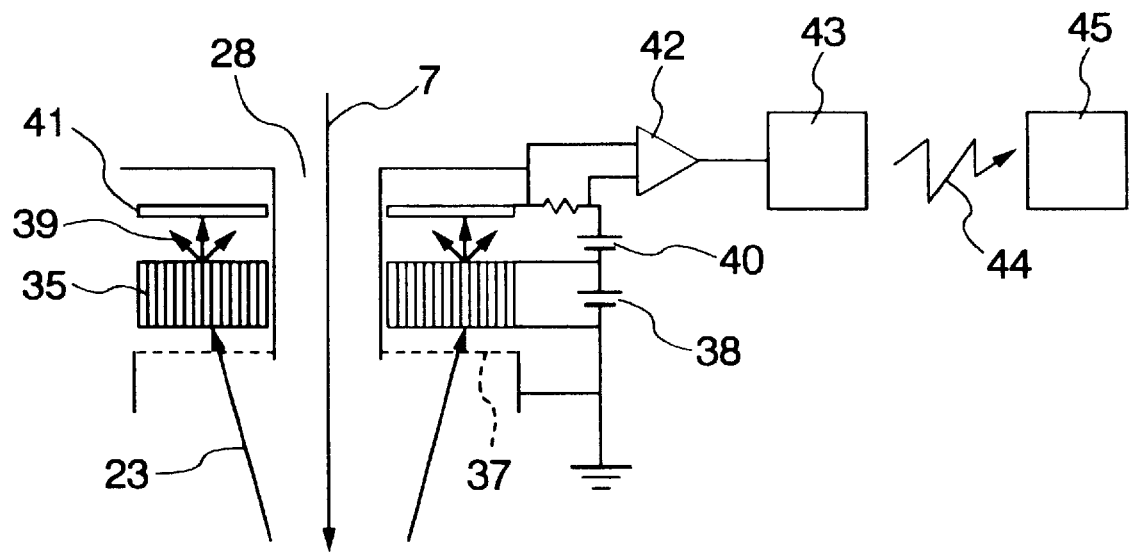
FIG. 6 is a schematic view, partly in block diagram form, useful in explaining a structure of an embodiment in which a channel plate employed therein is used to detect the secondary signal.

Referring to FIG. 6, there is shown an embodiment wherein the secondary signal is detected using a multi-channel plate detector. A multi-channel plate detector body 35 has a disc-like shape and has a central hole 28 through which the primary electron beam is to pass. In addition, a mesh 37 is provided below the multi-channel plate detector body 35 and is grounded. With such a structure, after having passed through the central hole 28 of the multi-channel plate, the accelerated primary electron beam 7 is condensed by the objective lens so as to be applied to the sample. The secondary electrons 23 which have been generated from the sample pass through the mesh 37 to be made incident on the channel plate detector body 35. The secondary electrons 23 which have been made incident on the channel plate detector body 35 are accelerated and amplified by an amplification voltage 38 which is applied across both the end portions of the channel plate detector body 35. The electrons 39 which have been amplified are further accelerated by an anode voltage 40 to be captured by an anode 41. After having been amplified by an amplifier 42, the secondary electron signal thus captured is converted into an optical signal 44 by an optical conversion circuit 43. The reason for converting the secondary electron signal into an optical signal 44 is that the amplifier 42 is in a floating state due to the amplification voltage 38 of the channel plate body 35. The optical signal 44 is converted into an electrical signal again in an electrical conversion circuit 45 at ground electric potential so as to be utilized as the intensity modulation signal of the scanning image.

Now, the anode 41 may be divided into two or four portions in order to obtain information concerning the emission direction of the secondary electrons 23. In this case, it is to be understood that the number of amplifiers 42, optical conversion circuits 43 and electrical conversion circuits 45 corresponding to the division number is required, and also signal processing calculating the divided signals is carried out.

Figure 7:
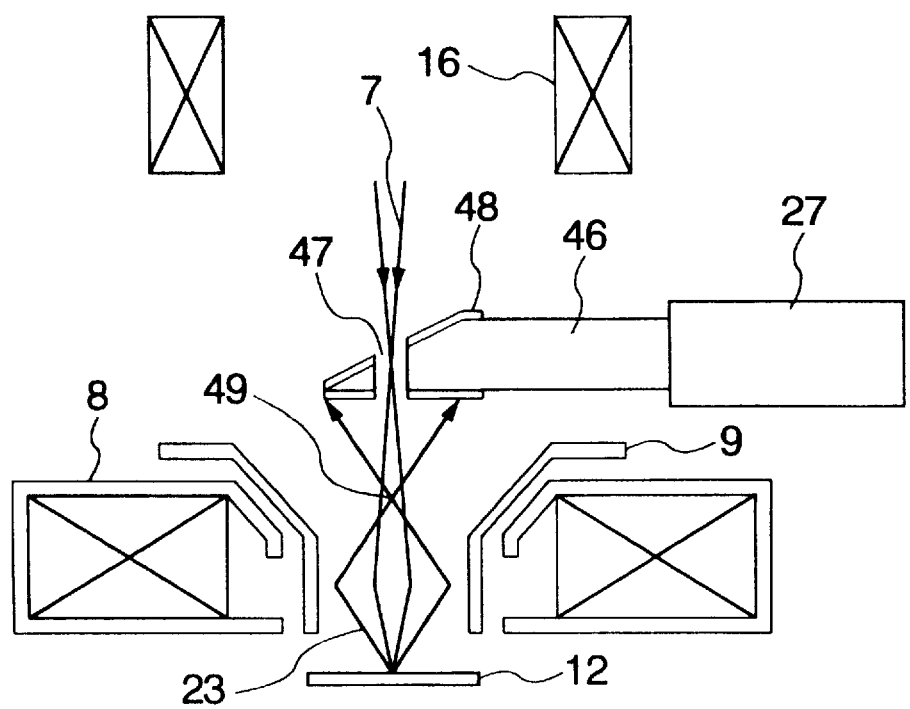
FIG. 7 is a schematic view useful in explaining a structure of an embodiment in which a scintillator employed therein is used to detect the secondary signal.

Referring to FIG. 7, there is shown an embodiment wherein the secondary signal is detected utilizing a monocrystalline scintillator. In FIG. 7, a monocrystalline scintillator 46 is, for example, constructed in such a way that a cylindrical YAG monocrystal is cut diagonally and an aperture 47 through which the primary electron beam passes is bored through the cutting plane thereof. In this connection, the head portion of the scintillator 46 is coated with a conductive film 48, such as metal or carbon, which is grounded. The secondary electrons 23 which have been generated from the sample 12 are applied to the scintillator 46, thereby causing the scintillator 46 to emit light. The light thus emitted is reflected from the diagonal portion to be introduced into the photomultiplier 27 through the light guide formed by the cylindrical portion so as to be detected and amplified therein. Incidentally, while in the present embodiment, both the light emitting portion and the light guide of the scintillator 46 are made of YAG monocrystal, the present invention is not limited thereto. That is, alternatively, a structure may be adopted in which only the light emitting portion for detecting the secondary electrons is made of YAG monocrystal or fluorescent substance, and also the light guide is made of a transparent body such as glass or resin.

Next, the description will hereinbelow be given with respect to a control method for carrying out efficient detection of the secondary signal with reference to FIG. 7. Since the secondary signal (e.g., the secondary electrons) passes through magnetic field of the objective lens 8, the secondary signal undergoes the lens function, and as a result, a crossover 49 of the secondary electrons is formed. If the secondary electrons are focused at the aperture 47 of the scintillator 46 due to the lens function, almost all the secondary electrons pass through the aperture 47 and hence they can not be detected. Then, the secondary electrons are adjusted so as to be focused at the position before or after the target plate in order to enhance the detection efficiency. In the present embodiment, both the post-acceleration voltage and the superimposed voltage applied to the sample are controlled so as to prevent the focusing position of the secondary electrons to be changed with changing acceleration voltage (the substantial acceleration voltage).

When the current which is caused to flow through the lens coil is I, the number of turns of the coil is N, and the acceleration voltage of the electron when passing through the lens magnetic field is V, the focal length of the electromagnetic lens is a function of a variable I N/V ½. When the electron gun acceleration voltage is Vo and the post-acceleration voltage applied to the acceleration tube is Vb, the acceleration voltage when the primary electrons pass through the lens magnetic field is expressed by (Vo+Vb). Since the sample position (the focal length) is fixed, I N/(Vo+Vb) ½ always becomes a constant value (=a). When the superimposed voltage applied to the sample is Vr, the acceleration voltage when the secondary electrons pass through the lens magnetic field is expressed by (Vr+Vb), and a variable I N/V ½ is expressed by the following expression:

$$I\,N/V\,\tfrac{1}{2} = a(Vo+Vb)\tfrac{1}{2}/(Vr+Vb)\tfrac{1}{2} = a\{1+(Vb/Vo)\}\tfrac{1}{2}/\{(Vr/Vo)+(Vb/Vo)\}\tfrac{1}{2}$$

From this expression, it will be understood that if the ratios of Vr/Vo and Vb/Vo are controlled so as to be constant, the focal length of the secondary electrons becomes constant. That is, if both the post-acceleration voltage Vb and the superimposed voltage Vr applied to the sample are controlled with the ratios of Vr/Vo and Vb/Vo made constant, the focal position of the secondary electrons can be controlled so as to be constant without depending on the acceleration voltage the substantial acceleration voltage).

Figure 8:
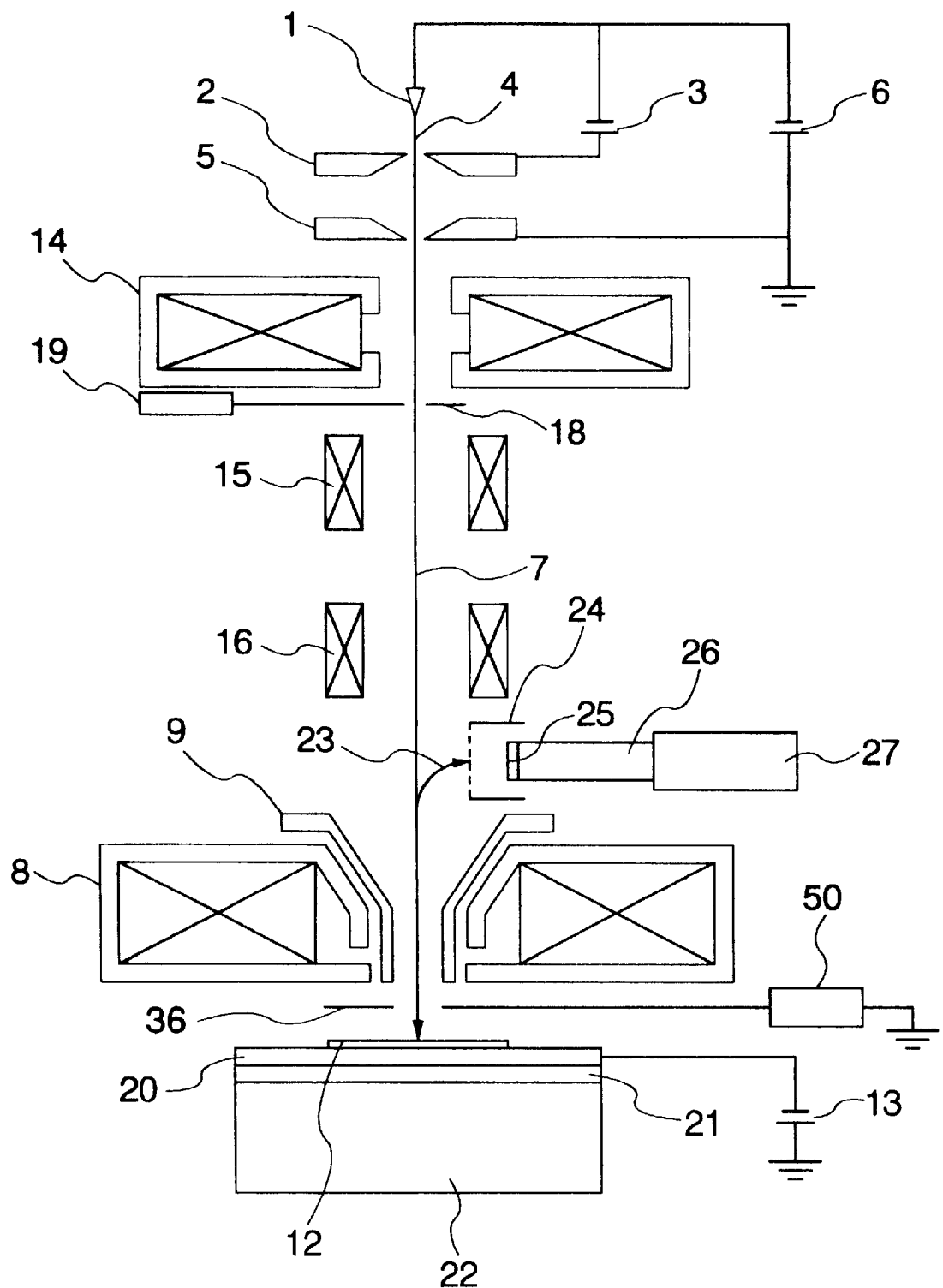
FIG. 8 is a schematic view useful in explaining a structure of an embodiment in which the intensity of an electric field applied to a sample is controlled.

Referring to FIG. 8, there is shown an example wherein a control electrode for controlling the electric field applied to the surface of the sample is additionally provided. As apparent from the figure, a control electrode 36 is provided between the objective lens 8 and the sample 12, and a control voltage 50 is applied to the control electrode 36. The control electrode 36 has a hole through which the electron beam passes. The strength of the electric field which is formed between the acceleration tube 9 and the sample 12 and is applied to the sample 12 is controlled by the control electrode 36. This structure is effective in the case where it is inconvenient when the electric field of high strength is applied to the sample. For example, this inconvenient case results from the problem that the elements will be damaged if a high electric field is applied to the wafer having a semiconductor integrated circuits formed therein.

In addition, this structure is effective in the specific case where when the periphery of the wafer is coated with an oxide film, an electrical contact can not be made successfully between the wafer and the sample holder 20. More specifically, this occurs in the case where both the side face and the rear face of the sample (the wafer) are covered with the insulating material and an electrical connection for retarding can not be carried out. In addition, that reason is that in the case where the sample (wafer) 12 is placed within the electric field which is generated between the sample holder 20 and the objective lens 8 and hence no control electrode is provided, since only the intermediate electric potential between the superimposed voltage 13 applied to the sample holder 20 and the grounding electric potential of the objective lens 8 is applied to the sample 12, the normal observation an not be carried out.

In addition, the electric potential at the control electrode 36 is made either the same as that of the sample holder 20 to which the superimposed voltage 13 is applied or higher than that of the sample holder 20 by positive several tens of volts, whereby it is possible to prevent any element from being damaged and also it is possible to prevent the electric potential of the wafer from floating from the electric potential of the sample holder 20. In this case, the control electrode 26 needs to be made large enough to always cover the whole sample (wafer).

Figure 9:
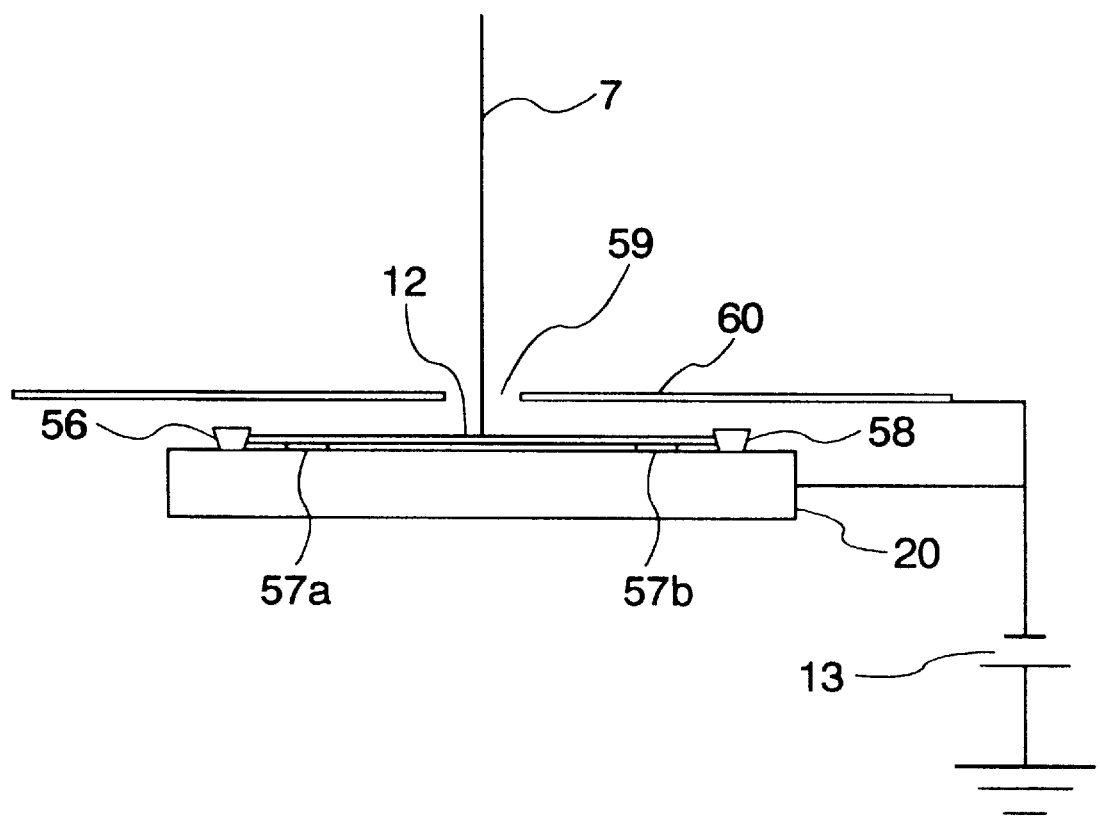
FIG. 9 is a schematic view showing a structure of an example of an embodiment in which a control electrode is provided above the sample.

Referring to FIG. 9, there is illustrated a schematic view showing a structure of an example in the case where a control electrode is additionally provided.

A control electrode 60 having an aperture 59 through which the primary electron beam passes is provided above the sample (wafer) 12. The same voltage as the superimposed voltage 13 applied to the sample holder 20 is applied to the control electrode 60. When the control electrode 60 at the same electric potential as that of the sample holder 20 is arranged above the sample (wafer) 12, the wafer is necessarily surrounded by the metallic members at the same electric potential and hence the electric potential of the wafer becomes the same as that of the surrounding metallic members. Strictly speaking, the electric potential of the wafer is slightly different as an error from that of the surrounding metallic members due to invasion of the electric field into the aperture 59 through which the primary electron beam passes. This error corresponds approximately to the ratio of the area of the aperture 59 to the areas of the sample (wafer) 12. For example, when the wafer is 8 inches in diameter and the aperture 59 is 10 mm in diameter, the area ratio is 1/400 and hence the error in the electric potential is only 1%. This value is sufficiently small.

In the above-mentioned structure, the same electric potential as that of the metallic members surrounding the wafer can be applied to the wafer.

As a result, even in the case where both the front face and the rear face of the wafer are coated with the electrically insulating film and hence the wafer can not be electrically connected to the specimen stage or the like, the voltage for retarding can be applied.

In this embodiment, within the sample holder 20, by structuring at least the portion located under the sample (wafer) 12 with a conductor for applying the superimposed voltage, then the wafer is covered with a metal of the same potential. The sample holder itself might be a conductor, or a conductor might be inserted into the sample holder.

Figure 10:
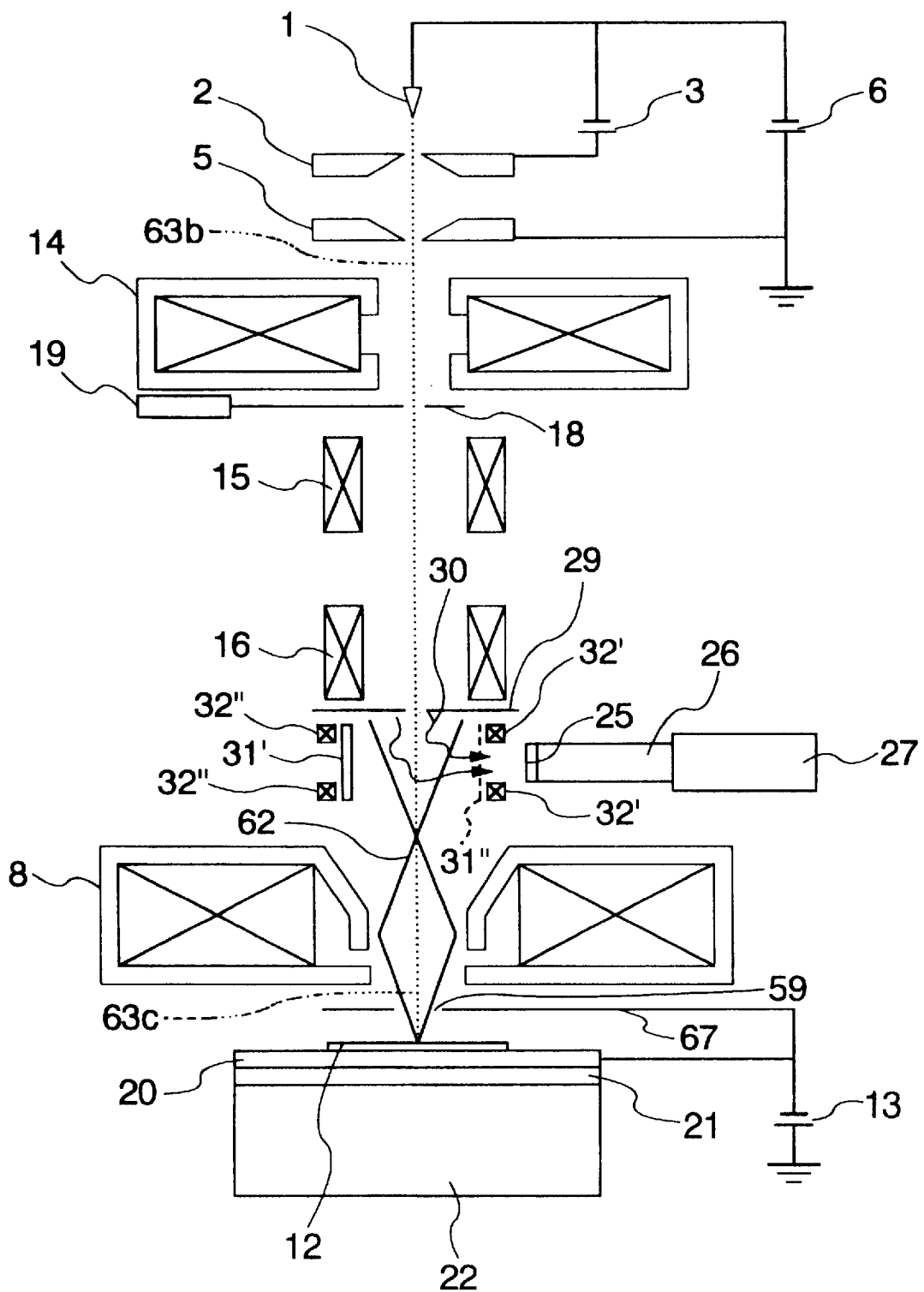
FIG. 10 is a schematic view showing a structure of an example of a charged particle microscope including a control electrode.

Referring to FIG. 10, there is illustrated a schematic view showing a structure of another example wherein the control electrode is additionally provided.

The control electrode 60 is provided between the sample (wafer) 12 and the objective lens 8. The same voltage as the superimposed voltage 13 applied to the sample holder 20 is applied to the control electrode 60. As a result, the sample (wafer) 12 is surrounded by both the sample holder 20 and the control electrode 60 to which the same voltage is respectively applied. Then, as described above, even when the sample (wafer) 12 is coated with the electrically insulating film, the same voltage as the superimposed voltage 13 can be substantially applied to the sample (wafer) 12.

The aperture 59 of the control electrode 60 normally has a circular shape. However, the aperture may have any other shape other than a circular shape. In addition, the aperture 59 needs to have a size with which the field of view to be observed is not hindered. In the present embodiment, the aperture 59 is 4 mm in diameter. Since a space between the control electrode 60 and the sample (wafer) 12 is 1 mm, there is a field of view with 4 mm diameter. In addition, since the retarding electric field reaches the wafer through the aperture 59, the secondary electrons can be effectively made to rise above the objective lens 8. When the diameter of the aperture is decreased, the retarding electric field does not reach the sample (wafer) 12. However, in the case where the wafer needs to be inclined, or in the case where the sample has irregularity, such a condition is suitable therefor and hence it is possible to reduce occurrence of astigmatism and deviation in field of view.

The stage 22 is provided in order to observe an arbitrary position on the sample (wafer) 12. Now, when a position which deviates largely from the center point of the sample (wafer) 12 is an object of observation, the sample (wafer) 12 needs to be largely moved. In this connection, if the sample (wafer) 12 is positioned outside the control electrode 60, the electric potential of the sample (wafer) 12 is changed and hence the fixed retarding voltage can not be applied thereto.

In order to cope with this situation, in the present embodiment, the control electrode is formed along the movement orbit of the sample (wafer) 12. By adopting this structure, even if the position of sample (wafer) 12 is changed due to the movement of the specimen stage 22, a fixed retarding voltage can be applied, and also it is possible to prevent any element from being damaged due to application of the electric field generated between the objective lens 8 and the sample (wafer) 12 thereto.

In addition, in the present embodiment, it is preferable to arrange the control electrode having a size over the movement range of the wafer. More specifically, the diameter of the control electrode which is used to observe the overall surface of the 8-inch wafer is set to 400 mm. By adopting such a structure, however the wafer may be moved, the voltage applied to the wafer can be maintained constant.

Incidentally, while the control electrode has a flat plate shape in the present embodiment, the present invention is not limited thereto. That is, the control electrode is formed so as to have a mesh-like shape or a shape having a large number of holes or slits formed therein, whereby the vacuum exhaust property can be improved. In this case, the diameter of the hole or the width of the slit is preferably smaller than the space between the wafer and the control electrode.

In FIG. 10, at the time when the primary electrons 63c have passed through the aperture 59 of the control electrode 60 and are applied to the sample (wafer) 12, the secondary electrons 62 are generated from the same (wafer) 12. The secondary electrons 62 thus generated are conversely accelerated by the retarding electric field to the primary electrons 63c so as to be introduced above the objective lens 8. In this connection, since the secondary electrons 62 undergo a lens function due to the magnetic field of the objective lens 8, the secondary electrons 62 are introduced above the objective lens 8 while forming a focal point as shown in the figure.

The secondary electrons 62 thus introduced collide with the target plate 29, thereby generating secondary electrons 30. These secondary electrons 30 are deflected by an electric field generated by a deflection electrode 31' to which a negative electric potential is applied and a deflection electrode 31" to which a positive electric potential is applied, the deflection electrodes 31' and 31" being arranged so as to be mutually opposite to each other. Since the deflection electrode 31" is formed of a mesh, the secondary electrons 30 pass through the mesh to be detected by the scintillator 25. Reference numerals 32' and 32" designate deflection coils, respectively, which generate a magnetic field crossing the electric field generated by both the deflection electrodes 31' and 31", and serve to cancel the deflection function influencing the primary electron beam 63b provided by both the deflection electrodes 31' and 31".

Incidentally, the control electrode 64 is cooled by cooling means (not shown), thereby enabling contamination, which is provided by scanning the surface of the sample with the primary electron beam 63c.

Figure 11:
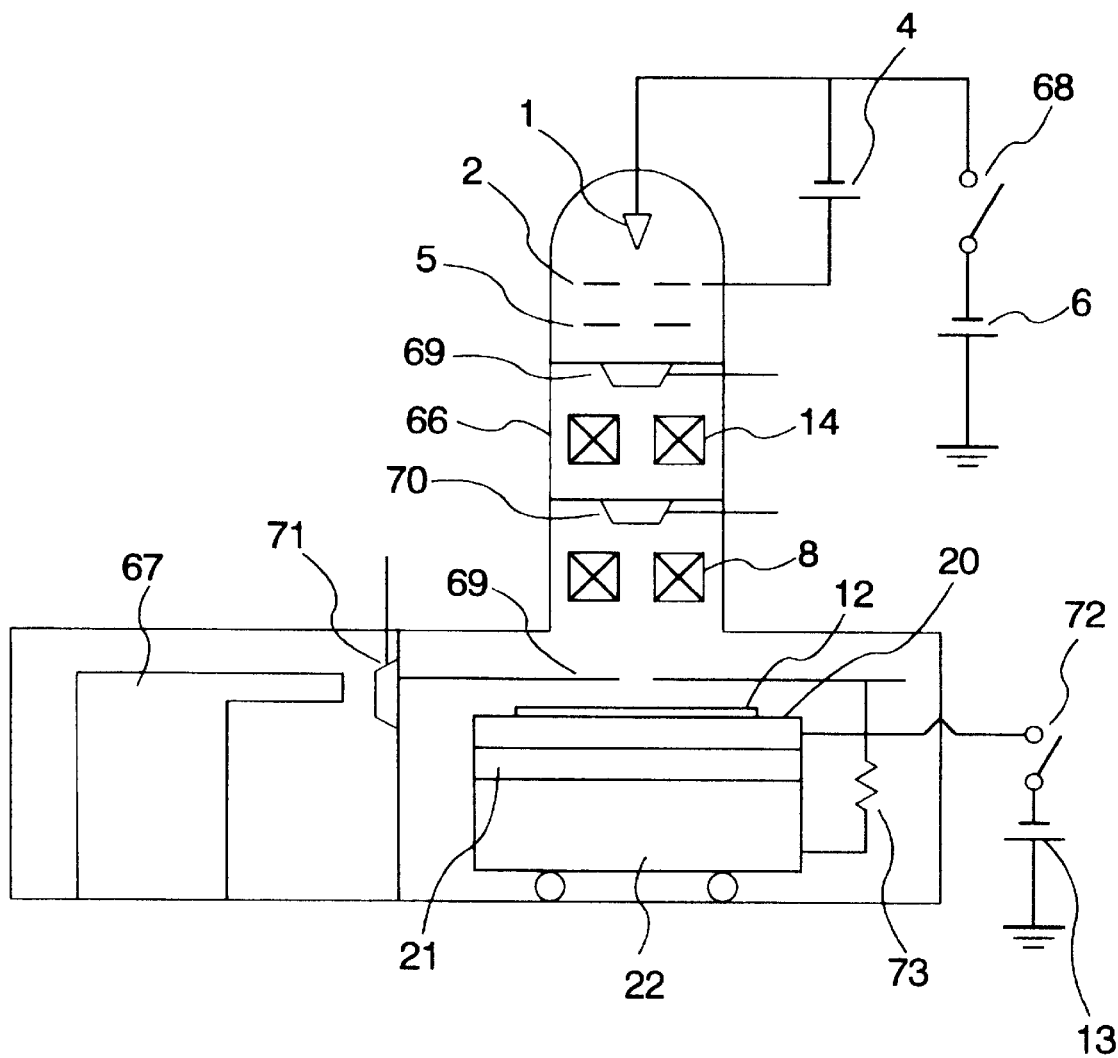
FIG. 11 is a schematic view showing a structure of another example of a charged particle microscope including a control electrode.

Referring to FIG. 11, there is illustrated a schematic view showing a structure of still another example in the case where the control electrode is additionally provided.

The elements such as the field emission cathode 1, the extraction electrode 2, the anode 5, the condenser lens 4, the objective lens 8, the sample 12, the sample holder 20, the electrical insulating stage 21 and the specimen stage 22 are accommodated in an evacuable enclosure 66. Incidentally, the illustration of a vacuum exhaust system is omitted here for the sake of simplicity.

Now, in the state in which the negative superimposed voltage is applied to the sample 12, it should be avoided that the work of exchanging the sample is carried out by a sample exchange mechanism 67, and the evacuable enclosure 66 is made at atmospheric pressure. In other words, only when the surface of the sample 12 is scanned with the electron beam, need the superimposed voltage 13 be applied to the sample 12.

Then, in the present embodiment, only when all of a first condition in which as the preparation operation in attaching/exchanging the sample, a switch 68 is closed so as to apply the acceleration voltage 6, a second condition in which both valves 69 and 70 are opened which are provided between the field emission cathode 1 and the sample 12, and a third condition in which a valve 71 is closed through which the sample exchange mechanism 67 passes in order to place the sample 12 on the specimen stage 22 are fulfilled, is the control carried out in which a switch 72 is closed so as to apply the superimposed voltage 13 to the sample 12.

In addition, the sample holder 20 is electrically connected to the specimen stage 22 through a discharging resistor 73 so that at the time when the switch 37 is opened, the electric charges accumulated in the sample 12 are speedily discharged at a fixed time constant through the sample holder 20, the discharging resistor 73 and the specimen stage 22 (which is grounded) so as to decrease the electric potential of the sample 12. The discharging resistor may also be self-contained in power source of the superimposed voltage 13.

According to the apparatus in a preferred embodiment of this invention, a sequence is incorporated in which the acceleration voltage can be applied under condition in which the degree of vacuum in the periphery of the field emission cathode 1 is less than a predetermined value, and also valves 69 and 70 are opened only when the degree of vacuum in the evacuable enclosure is more than a predetermined value. According to utilization of such sequence, an accident such as irradiating electron beam by a human error irrespective that preparation for irradiating electron beam has not been established.

In addition, in the present embodiment, the description has been given in which only when all the above-mentioned three conditions are fulfilled, the superimposed signal 13 is applied. However, the present invention is not limited thereto. That is, even when one or two of the conditions are fulfilled, the switch 72 may be closed.

Figure 12:
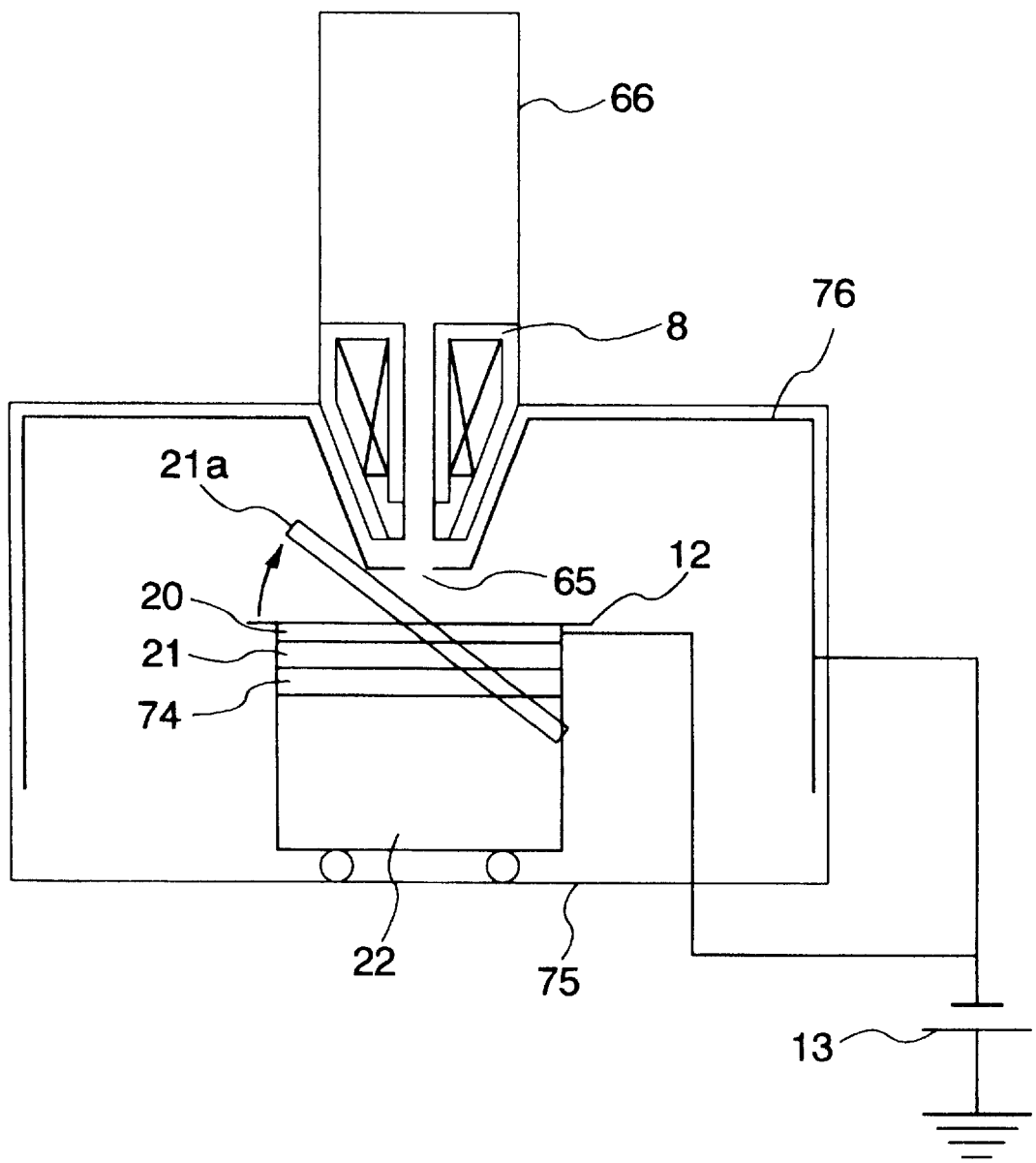
FIG. 12 is a schematic view showing a structure of an example of a charged particle microscope in which a control electrode is formed along an internal face of a sample chamber.

FIG. 12 shows another embodiment of an arrangement having a control electrode added thereto. This is an application of the invention to a scanning microscope having a sample stage that enables a sample to be tilted. In this embodiment, the control electrode 76 is mounted to the scanning microscope so that it may cover the top of the sample 75. From another viewpoint, the control electrode 76 is located along the shape of the objective lens. The objective lens is shaped so that it does not obstruct the movement of the sample 12. As shown in FIG. 12, if the apparatus provides a tilting device, the objective lens is shaped keenly toward the sample 12. The location of the control electrode along the objective lens so shaped results in keeping a smooth movement of the sample.

This arrangement allows the sample (wafer) 12 to be enclosed by the sample holder 20 and the control electrode 76 irrespective of the position and the inclination of the sample (wafer) 12. This arrangement disallows an electric field to be generated on the surface of the sample (wafer) 12. A numeral 20a denotes the state where the sample (wafer) 12 is inclined. A numeral 74 denotes an inclining mechanism built in a sample stage 22. In this embodiment, it is preferable that the aperture 65 of the control electrode 76 has a smaller diameter than a distance between the aperture 65 and the sample 12. For improving the sensing efficiency of secondary electrons, the voltage to be applied to the control electrode 76 is shifted by a few tens of positive voltages rather than the voltage to be applied to the sample 12.

In order to apply a retarding voltage onto the sample, it is preferable to set each voltage for the sample or the control electrode so that a desirous voltage is applied to the sample. This setting of each voltage to the sample or the control electrode is a result of considering the impact of the compound electric fields derived by the voltages applied onto the sample and onto the control electrode.

Further, the aperture may be made larger in diameter. The larger aperture allows an electric field for extracting the secondary electrons to be applied onto the sample 12. In this case, the inclined sample causes the observation position to be shifted. The adverse effect given by this shift may be eliminated by measuring the inclination and the shift in advance and deflecting the electron beam accordingly or correcting the specimen stage 22 such as by horizontal movement of the stage 22. The control electrode 76 is made of a nonmagnetic materials so that it does not have an adverse effect on the characteristics of the objective lens 8.

In this embodiment, the control electrode is located so that it covers the interior of the specimen chamber. This location is not necessary. The control electrode is just required to be shaped along the movement of the sample. Even this minimum shape allows the sample to be enveloped by the sample holder and the control electrode. In the foregoing description, the sample holder has been described as a conductor specified in the invention of the present application. In place, a conductor may be located on or under the sample holder. In the foregoing embodiments, a conductor that is larger than the sample allows the sample (wafer) to be substantially enveloped by the control electrode and the conductor, thereby making it possible to apply a constant retarding voltage to the sample.

Figure 13:
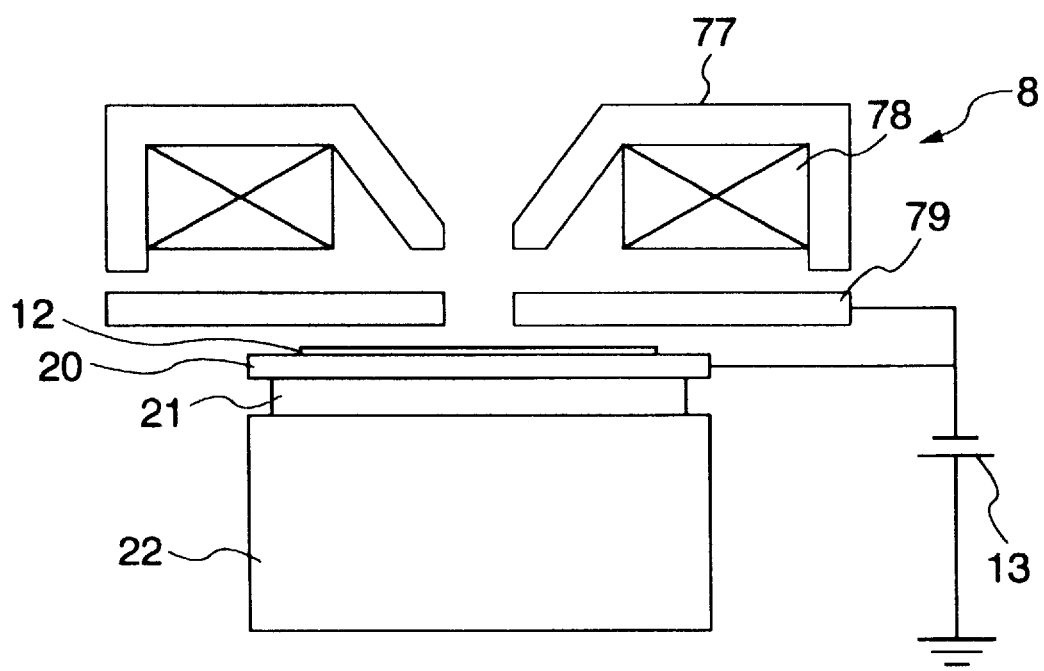
FIG. 13 is a schematic view showing a structure of an example in which a part of a magnetic path of an objective lens is made a control electrode.

FIG. 13 shows another arrangement of the scanning microscope where a control electrode is mounted. Herein, the control electrode is not grounded between the objective lens 8 and the sample 12. The objective lens 8 is constructed of an excitation coil 78, an upper magnetic path 77 and a lower magnetic path 79 so that the lower magnetic path 79 located opposed to the sample 12 is electrically insulated from the upper magnetic path 77 and the overlapping voltage 13 is applied to the lower magnetic path 79. In place, the potential to be applied to the lower magnetic path 79 may be derived as a positive potential from the sample 12. This makes it possible to efficiently conduct the secondary electrons onto the objective lens 8.

Figure 14:
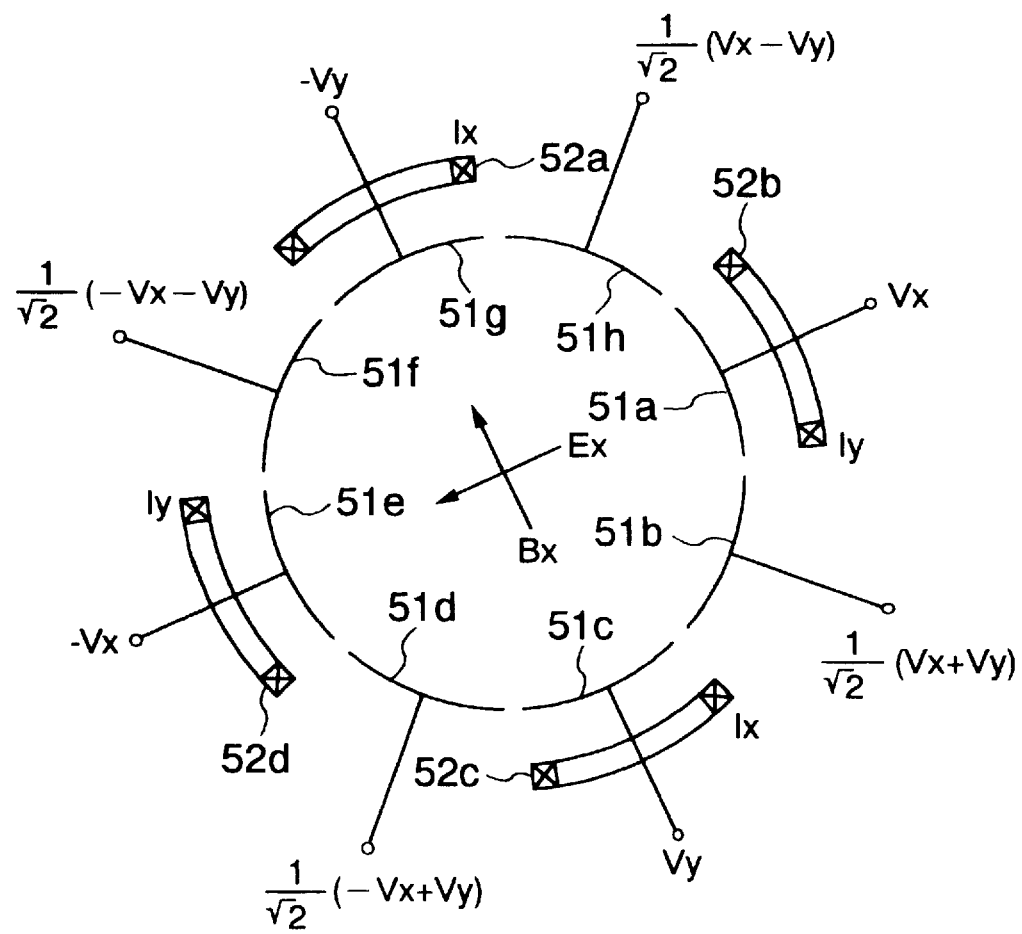
FIG. 14 is a schematic view useful in explaining a structure of an embodiment in which a scanning deflector is constituted by combination of an electric field and a magnetic field.

FIG. 14 is an explanatory view showing a scanning deflector for an electron beam that uses a combination of an electric field and a magnetic field. If a secondary electron detector is mounted on the scanning deflector, the scanning deflector acts to deflect the secondary electrons generated from the sample when those electrons passes through the deflector itself. At a low magnification where the electronic beam has a larger angle of scanning deflection, the secondary electrons are deflected more, so that those electrons may rush against the inner wall of a beam passage, which may obstruct the sensing of the secondary electrons. The arrangement of this embodiment is intended to overcome this shortcoming. The scanning deflector is constructed of eight (8) polar electrostatic deflectors $51a$ to $51h$ and magnetic field deflectors $51a$ to $51h$.

Now, consider the x-axial deflection. The application of a positive potential to the electrodes $51h$, $51a$ and $51b$ of the 8 pole electrostatic deflectors and a negative potential to the electrodes $51a$, $51e$ and $51f$ results in yielding a deflected electric field Ex. As shown in FIG. 14, a potential of Vx is applied to the electrodes $51a$ and $51e$ and a potential of a half of Vx is applied to the electrodes $51h$, $51b$, $51d$ and $51f$ located on both sides of the line-drawn between the electrodes $51a$ and $51e$. This is a well-known technique of yielding a uniform electric field. Concurrently with the electric field, current Ix is passed through the coils $52a$ and $52c$ of the magnetic deflector $52$ so that a magnetic field Mx is generated in the orthogonal direction to the magnetic field Ex as shown in FIG. 14. This electric field Ex and the magnetic field Et act in concert to cancel the deflection developed for the secondary electrons coming form below or magnify the primary electrons fired from above.

The deflection θ(S) developed for the secondary electrons coming from below is a difference between a deflection θ(B) caused by the magnetic field and a deflection θ(E) caused by the electric field, which is arithmetically represented as follows.

$$\theta(S)=\theta(B)-\theta(E)=L/8\ Ex/Vr-(e/2m)_{1/2}\ BxL/Vr_{1/2}$$

where L denotes an active distance of the electric field and the magnetic field, e and m denotes a charge and a mass of electrons, and Vr denotes an acceleration voltage given when the secondary electrons pass through the scanning deflector. Since the ratio of Ex to Bx is represented by the following expression, no deflection is developed for the secondary electrons coming from below.

$$Bx/Ex=(2m/e)_{1/2}/8Vr_{1/2}$$

On the other hand, the application of the magnetic field deflection to the electric field deflection enables the deflection of the primary electrons to be represented as follows.

$$\theta(o)=\theta(B)+\theta(E)=(e/2m)_{1/2}BxL/Vo_{1/2}+L/8Ex/Vo_{1/2}$$

where Vo is a primary acceleration voltage.

Hence, in the condition that no deflection takes place about the secondary electrons, the angle of deflection θ(o) is represented as follows.

$$\theta(o)=(e/2m)_{1/2}BxL\ \{1+\{Vr/Vo\}_{1/2}\}/Vo_{1/2}$$

The foregoing description has been oriented to the x-axial deflection. The description holds true to the y-axial deflection. That is, by setting the potential of the electrode $51c$ as Vy, the potentials of the electrodes $51b$ and $51d$ as $Vy/2_{1/2}$, the potential of the electrode 51 g as –Vy, and the potentials of the electrodes $51f$ and $51h$ as $-Vy2_{,1/2}$, a y-axial deflected electric field Ey is obtained. At a time, by passing the current Iy through the coils $52b$ and $52d$ of the magnetic field deflector, the magnetic field By crossed with the electric field Ey is obtained. Like the description above, the electric field Ey and the magnetic field By act in concert to cancel the deflection developed for the secondary electrons coming from below or strength the primary electrons coming from above.

In actuality, the deflection is a combination of the x-axial deflection and the y-axial deflection. Hence, the potential of each deflection electrode is an addition of the x-axial deflecting potential as shown in FIG. 14. The actual apparatus is constructed to have two stages of the deflector, that is, an upper and a lower scanning deflectors so that the deflected primary electrons are allowed to pass through the center of the objective lens. The potentials Vx and Vy of the deflection electrode and the deflection coil currents Ix and Iy are changed with time while keeping the foregoing relation, for realizing the desired scanning of the primary electron beam onto the sample.

Figure 15:
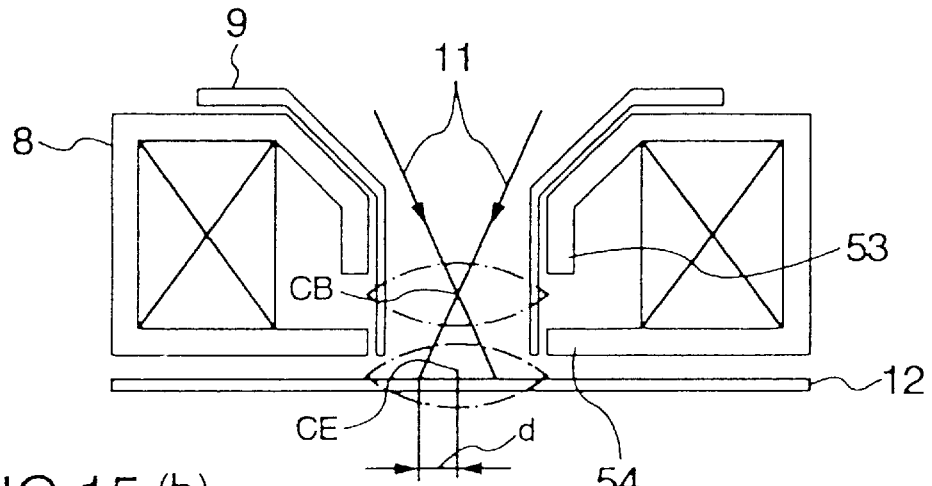
FIG. 15 is a schematic view useful in explaining a structure of an embodiment in which a lens center of an electromagnetic lens is aligned with the lens center of an electromagnetic lens.
Figure 15:
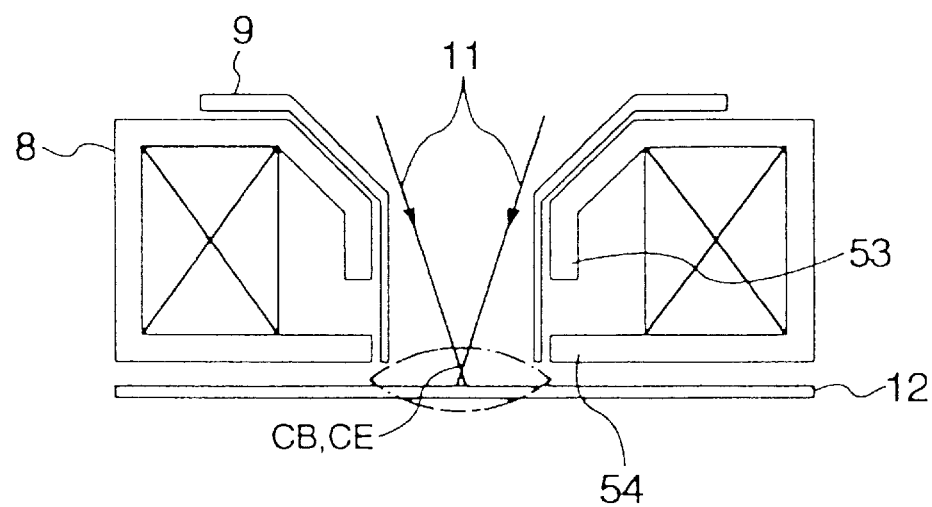

In turn, the description will be oriented to the relation between the lens center of the magnetic field type objective lens and the lens center of the electrostatic lens formed between the acceleration tube and the sample. FIG. 15A is an explanatory view showing a problem caused if the center CB of the objective lens 8 does not coincide with the center CE of the electrostatic-static lens formed between the acceleration tube 9 and the sample 12. In this case, the primary electron beam 11 accelerated at a post stage is deflected so that the beam 11 passes through the center CB of the magnetic field lens but it shifted only by a distance d from the center CE of the electrostatic lens. The larger shifting distance d results in adding a spherical aberration to the lens effect of the electrostatic lens, thereby distorting the scan image.

FIG. 15B shows the arrangement where the lens center CB of the magnetic field type objective lens 8 coincides with the lens center CE of the electrostatic lens formed between the acceleration tube 9 and the sample 12. In this embodiment, an upper magnetic pole 53 of the objective lens 8 is projected opposed to the sample 12, so that the magnetic field is produced in a space between the sample 12 and the acceleration tube 9 where the electrostatic lens is formed, for making the centers of both lenses coincide with each other. As a result, no lens effect of the electrostatic lens is applied on the primary electron beam 11 accelerated at a post stage. Hence, the resulting scan image is not distorted.

Figure 16:
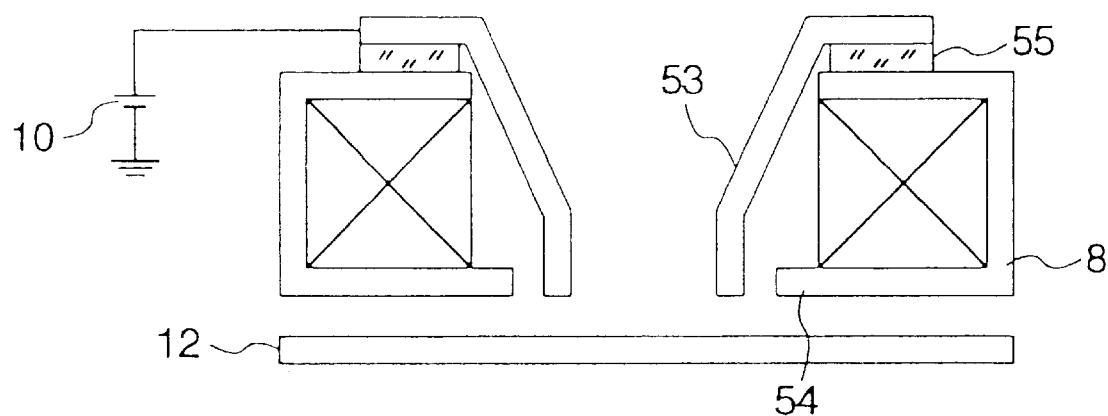
FIG. 16 is a schematic view useful in explaining a structure of an embodiment in which magnetic poles of a magnetic lens serve as an acceleration tube.

FIG. 16 shows a structure of the objective lens 8 for more effectively realizing the coincidence of the centers between the magnetic field lens and the electrostatic lens. In the foregoing illustrative embodiments, the acceleration tube 9 is inserted into the electron beam passage of the objective lens 8. In this construction, the shift of the axial center between the electrostatic lens produced by the acceleration tube and the magnetic field lens produced by the objective lens results in lowering resolution. For avoiding this unfavorable state, it is necessary to precisely keep the mechanical centers of the lenses in alignment with each other. This embodiment is concerned with this point. The upper magnetic pole 53 is projected to the end level of the lower magnetic pole 54 and faces the sample 12. The upper magnetic pole 53 is electrically insulated from the remaining portion of the objective lens by an insulating plate 55. The voltage 10 accelerated at a post stage is applied to the upper magnetic pole 53.

According to this embodiment, the upper magnetic pole for defining the lens center of the objective lens 8 is shared with the post-acceleration electrode. This does not bring about any shift between the electrostatic lens and the magnetic field lens. Further, the upper magnetic pole 53 of the magnetic field lens is directly opposed to the sample 12 and the post-acceleration voltage is applied to the upper magnetic pole 53. This makes it possible to keep the lens centers of the electrostatic lens and the magnetic field lens in alignment with each other.

What is claimed is:

1. A scanning microscope for producing a two-dimensional scan image of a sample and having an electron source, scanning deflectors for scanning a primary electron beam fired from said electron source on said sample, an objective lens for converging said primary electron beam, and secondary signal detectors for detecting a secondary signal reflected from said sample, comprising:
   means for applying a post-acceleration voltage of said primary electron beam to an acceleration tube located in an electron beam path of said objective lens;
   means for applying a negative potential to said sample; and
   wherein a retarding electric field against said primary electron beam is created between said acceleration tube and said sample and said secondary signal detectors are located closer to said electron source than is said acceleration tube.

2. A scanning microscope as claimed in claim 1, wherein said secondary signal detectors each include a conductive target plate having an aperture through which said primary electron beam passes, extracting means for extracting said secondary electrons reflected on said target plate, and detecting means for detecting said extracted secondary electrons.

3. A scanning microscope as claimed in claim 2, wherein said extracting means produces an electric field and a magnetic field crossed at right angles therewith and cancels the deflection of said primary electron beam caused by said electric field through the effect of said magnetic field.

4. A scanning microscope as claimed in claim 1, wherein said secondary signal detector is a multi-channel plate having an aperture through which said primary electron beam passes.

5. A scanning microscope as claimed in claim 1, wherein said secondary electron detector is composed of a fluorescent material having an aperture through which said primary said primary electron beam passes and an optical detector for detecting luminance of said fluorescent material.

6. A scanning microscope as claimed in claim 1, wherein said secondary signal detectors are provided between said acceleration tube and said scanning deflector.

7. A scanning microscope as claimed in claim 1, wherein said secondary signal detectors are provided between said scan deflector and said electron source.

8. A scanning microscope as claimed in claim 1, wherein the first secondary signal detector is located between said acceleration tube and said scanning deflector and the second secondary signal detector is located between said scanning deflector and said electron source.

9. A scanning microscope as claimed in claim 8, wherein a scan image is formed by using a detection signal from said first or second secondary signal detector or operating said detection signals from said first and second secondary signal detectors.

10. A scanning microscope as claimed in claim 9, wherein the sole use of said detection signal from said first or second secondary signal detector or the operational use of said signals from said first and second signal detectors is automatically selected according to a scanning magnification and given observatory conditions.

11. A scanning microscope as claimed in claim 1, wherein said scanning deflector is served through the effect of a combination of electrostatic deflection and magnetic field deflection and is adjusted to apply desirous deflection to said primary electron beam but no deflection to said secondary signal extracted from said sample.

12. A scanning microscope as claimed in claim 1, wherein a ratio of said post-acceleration voltage applied to said acceleration tube to an electron gun voltage applied to said electron source and a ratio of a voltage applied to said sample to an electron gun voltage applied to said electron source are kept constant.

13. A scanning microscope as claimed in claim 1, wherein the center of the lens produced by the magnetic field of said objective lens coincides with the center of said electrostatic lens formed between said acceleration tube and said sample.

14. A scanning microscope as claimed in claim 1, wherein an upper magnetic pole of said objective lens is electrically insulated from the remaining part of said objective lens and said insulated upper magnetic pole is replaced with said acceleration tube.

15. A scanning microscope for producing a two-dimensional scan image of a sample comprising:
   a. an electron source emitting a primary electron beam along an electron beam path;
   b. scanning deflectors for scanning said primary electron beam on said sample;
   c. an objective lens, through which said electron beam path extends, for converging said primary electron beam;
   d. a secondary signal detector for detecting secondary electrons generated from said sample;
   e. an acceleration tube located in said electron beam path extending through said objective lens;
   f. a first voltage source applying a post-acceleration voltage for said primary electron beam to said acceleration tube; and
   g. a second voltage source applying a negative potential to said sample to result in a retarding electric field acting against said primary electron beam being formed between said acceleration tube and said sample.

16. A scanning microscope as claimed in claim 15, wherein said secondary signal detector is located closer to said electron source than is said acceleration tube.

17. A scanning microscope as claimed in claim 15, wherein said secondary signal detector includes a conductive target plate having an aperture through which said primary electron beam passes, an extractor extracting secondary electrons reflected from said target plate, and a detector detecting said extracted secondary electrons.

18. A scanning microscope as claimed in claim 17, wherein said extractor is adapted to produce an electric field and a magnetic field crossed at right angles therewith and cancels the deflection of said primary electron beam caused by said electric field through the effect of said magnetic field.

19. A scanning microscope as claimed in claim 15, wherein said secondary signal detector is a multi-channel plate having an aperture through which said primary electron beam passes.

20. A scanning microscope as claimed in claim 15, wherein said secondary electron detector includes a fluorescent material having an aperture through which said primary electron beam passes and an optical detector for detecting luminance of said fluorescent material.

21. A scanning microscope as claimed in claim 15, wherein said secondary signal detector is disposed between said acceleration tube and said scanning deflector.

22. A scanning microscope as claimed in claim 15, wherein said secondary signal detector is disposed between said scanning deflector and said electron source.

23. A scanning microscope as claimed in claim 15, wherein a first secondary signal detector is disposed between said acceleration tube and said scanning deflector and a second secondary signal detector is disposed between said scanning deflector and said electron source.

24. A scanning microscope as claimed in claim 23, wherein a scan image is formed by using a detection signal from said first or second secondary signal detector or from detection signals from said first and second secondary signal detectors.

25. A scanning microscope as claimed in claim 24, wherein the sole use of said detection signal from said first or second secondary signal detector or the operational use of said signals from said first and second signal detectors is automatically selected according to a scanning magnification and given observatory conditions.

26. A scanning microscope as claimed in claim 15, wherein said scanning deflector comprises a combination of electrostatic deflection and magnetic field deflection and is adjusted to apply desirous deflection to said primary electron beam but no deflection to said secondary signal extracted from said sample.

27. A scanning microscope as claimed in claim 15, wherein ratios of said post-acceleration voltage applied to said acceleration tube to an electron gun voltage applied to said electron source, and a ratio of a voltage applied to said sample to said electron gun voltage are kept constant.

28. A scanning microscope as claimed in claim 15, wherein said objective lens is produced by a magnetic field and the center of said objective lens coincides with the center of an electrostatic lens formed between said acceleration tube and said sample.

29. A scanning microscope as claimed in claim 15, wherein said objective lens includes an upper magnetic pole electrically insulated from the remaining part of said objective lens and said insulated upper magnetic pole is replaced with said acceleration tube.

* * * * *

UNITED STATES PATENT AND TRADEMARK OFFICE
CERTIFICATE OF CORRECTION

PATENT NO. : 5,872,358　　　　　　　　　　　　　　　Page 1 of 2

DATED : 16 February 1999

INVENTOR(S) : Hideo TODOKORO et al.

It is certified that error appears in the above-identified patent and that said Letters Patent is hereby corrected as shown below:

In the Abstract, line 14: Change "than" to --from--.

| Column | Line | |
|---|---|---|
| 2 | 23 | Change "down o" to --down to--. |
| 7 | 38 | Change "rigidly" to --precisely--. |
| 7 | 45 | Change "anc" to --can--; change "rigidly" to --precisely-- |
| 7 | 56 | Change "similarly" to --similar--; change "has the" to --has a--. |
| 8 | 22 | Change "a upper" to --an upper--. |
| 10 | 21 | Change "I N/V ½ =" to --I•N/V•½=--. |
| 10 | 26 | Change "I" to --I• --. |
| 10 | 33 | Change "I N/V ½=" to --I•N/V•½=--. |
| 10 | 43 | Change "the" to --(the--. |
| 10 | 58 | Change "high" to --strong--. |
| 10 | 67 | Change "that" to --another--. |
| 12 | 20 | Change "largely" to --significantly--. |
| 12 | 22 | Change "largely" to --significantly--. |
| 12 | 53 | Change "same" to --sample--. |

UNITED STATES PATENT AND TRADEMARK OFFICE
CERTIFICATE OF CORRECTION

PATENT NO. : 5,872,358
DATED : 16 February 1999
INVENTOR(S) : Hideo TODOKORO et al.

It is certified that error appears in the above-identified patent and that said Letters Patent is hereby corrected as shown below:

| Column | Line | |
|--------|------|---|
| 13 | 61 | After "irrespective" insert --of the fact--. |
| 13 | 63 | After "established" insert --, can be avoided--. |
| 14 | 20 | Change "disallows" to --prevents--. |
| 14 | 33 | Change "desirous" to --desirable--. |
| 14 | 47 | Delete "a". |
| 15 | 15 | Change "passes" to --pass--. |
| 15 | 42 | Change "form" to --from--. |
| 16 | 18 | Change "strength" to --strengthen--. |
| 16 | 25 | Change "deflectors" to --deflector--. |
| 16 | 42 | Change "it" to --is--. |
| 17 | 54 | Delete "said primary". |

Signed and Sealed this

Fourth Day of July, 2000

*Attest:*

Q. TODD DICKINSON

*Attesting Officer*     *Director of Patents and Trademarks*